(12) United States Patent
Araki et al.

(10) Patent No.: US 10,134,661 B2
(45) Date of Patent: Nov. 20, 2018

(54) SEMICONDUCTOR DEVICE

(71) Applicant: KABUSHIKI KAISHA TOSHIBA, Tokyo (JP)

(72) Inventors: Koji Araki, Himeji Hyogo (JP); Shinichi Kouyama, Himeji Hyogo (JP); Kazumi Ootani, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/438,457

(22) Filed: Feb. 21, 2017

(65) Prior Publication Data
US 2018/0090422 A1    Mar. 29, 2018

(30) Foreign Application Priority Data

Sep. 29, 2016  (JP) .................. 2016-191392

(51) Int. Cl.
H01L 23/495   (2006.01)
H01L 23/31    (2006.01)
H01L 23/29    (2006.01)

(52) U.S. Cl.
CPC ...... H01L 23/49548 (2013.01); H01L 23/293 (2013.01); H01L 23/3121 (2013.01); H01L 23/49517 (2013.01); H01L 23/49537 (2013.01)

(58) Field of Classification Search
CPC ......... H01L 23/49537; H01L 23/49861; H01L 23/4951; H01L 34/48257; H01L 23/49524
USPC ........................................ 257/735, 666, 676
See application file for complete search history.

(56) References Cited

U.S. PATENT DOCUMENTS

| | | | | |
|---|---|---|---|---|
| 4,935,803 A * | 6/1990 | Kalfus | .............. | H01L 23/49562 257/673 |
| 6,967,390 B2 | 11/2005 | Johnson | | |
| 7,071,523 B2 | 7/2006 | Yano et al. | | |
| 7,432,594 B2 * | 10/2008 | Ashida | .................. | H01L 21/566 257/735 |
| 7,528,485 B2 * | 5/2009 | Morita | ................ | H01L 23/4928 257/735 |
| 7,659,611 B2 * | 2/2010 | Otremba | .............. | H01L 23/3107 257/666 |

(Continued)

FOREIGN PATENT DOCUMENTS

JO    2005051031 A    2/2004
JP    H0595055 A      4/1993

(Continued)

Primary Examiner — S. V. Clark
(74) Attorney, Agent, or Firm — Patterson & Sheridan, LLP

(57) ABSTRACT

A semiconductor device comprises a first metal lead frame portion with a chip mounting surface, a second metal lead frame portion, and a semiconductor chip with a first surface facing and attached to the chip mounting surface of the first metal lead frame part and a second surface facing away from the chip mounting surface of the first metal lead frame part. A connector portion is electrical connected to the second metal lead frame portion and is attached to the second surface of the semiconductor chip. The connector portion covers the entirety of a planar area of the semiconductor chip when viewed along a direction orthogonal to second surface of the semiconductor chip.

19 Claims, 2 Drawing Sheets

(56) References Cited

U.S. PATENT DOCUMENTS

| | | | | |
|---|---|---|---|---|
| 2003/0122232 A1* | 7/2003 | Hirano | ............... | H01L 23/4334 257/678 |
| 2005/0077599 A1* | 4/2005 | Miura | ............... | H01L 23/4334 257/669 |
| 2007/0052075 A1* | 3/2007 | Funato | ............. | H01L 23/49524 257/676 |

FOREIGN PATENT DOCUMENTS

| | | |
|---|---|---|
| JP | H07106486 A | 4/1995 |
| JP | H07268332 A | 10/1995 |
| JP | H10125830 A | 5/1998 |
| JP | 2002057235 A | 2/2002 |
| JP | 2004064604 A | 2/2004 |
| JP | 2004128143 A | 4/2004 |
| JP | 2004356292 A | 12/2004 |
| JP | 2005057136 A | 3/2005 |
| JP | 2006013375 A | 1/2006 |
| JP | 3826898 B2 | 9/2006 |
| JP | 4620656 B2 | 1/2011 |
| JP | 5534335 B2 | 6/2014 |

\* cited by examiner

SEMICONDUCTOR DEVICE

CROSS-REFERENCE TO RELATED APPLICATION

This application is based upon and claims the benefit of priority from Japanese Patent Application No. 2016-191392, filed Sep. 29, 2016, the entire contents of which are incorporated herein by reference.

FIELD

Embodiments described herein relate generally to a semiconductor device.

BACKGROUND

A semiconductor chip sealed by molded resin is well known. In some variants, the chip has an electrode connected to a plate-like conductive metal member.

As electronic devices become smaller and have more functions, more semiconductor devices are included therein. An electromagnetic wave generated by one semiconductor device in an electronic device becomes noise to another semiconductor device in the electronic device and this noise degrades reliability of the other semiconductor devices.

DETAILED DESCRIPTION

Figure 1:
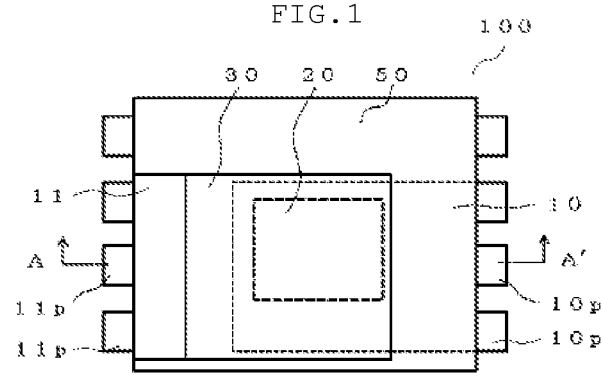
FIG. 1 shows a schematic plan view of a semiconductor device according to a first embodiment when viewed at A1-A1' line shown in FIG. 2.

According to one embodiment, a packaged semiconductor device comprises a first metal lead frame portion with a chip mounting surface and second metal lead frame portion. A semiconductor chip has a first surface facing and attached to the chip mounting surface of the first metal lead frame part and a second surface facing away from the chip mounting surface of the first metal lead frame part. A connector portion is electrical connected to the second metal lead frame portion and attached to the second surface of the semiconductor chip. The connector portion covers the entirety of a planar area of the semiconductor chip when viewed along a direction orthogonal to second surface of the semiconductor chip.

Hereinafter, example embodiments are described with a reference to drawings. In the following description, common portions in the drawings are identified with common reference symbols, and overlapping explanations or repeated elements or aspects maybe omitted. However, the disclosure is not limited to the example embodiments described below.

(First Embodiment)

Figure 2:
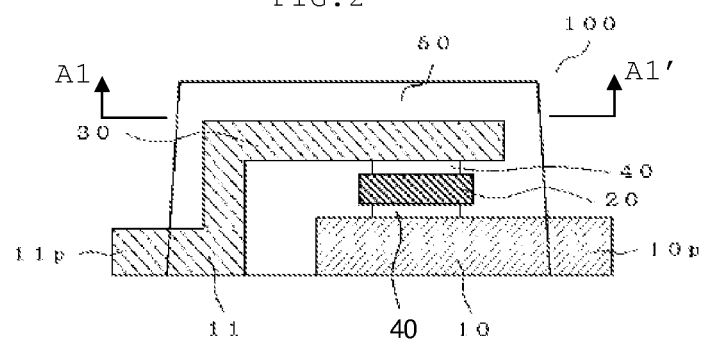
FIG. 2 shows a cross-sectional view of a semiconductor device according to the first embodiment taken along the A-A' line shown in FIG. 1.

FIG. 1 shows a schematic plane view of a semiconductor device 100 according to a first embodiment FIG. 2 shows a cross-sectional view taken along A-A' line shown in FIG. 1.

As depicted in FIG. 1, a semiconductor device 100 includes a lead frame bed (first metal part) 10, a lead frame post (second metal part) 11, a semiconductor chip 20, a source connector 30, a conductive material 40, and a resin 50.

The semiconductor chip 20 is mounted on the lead frame bed 10. The lead frame bed 10 is covered with the resin 50. A portion of the lead frame bed 10P projects out of the resin 50. The projecting portion 10P functions as a drain terminal, for example. Here, the lead frame bed 10 is electrically connected to a drain provided on a lower surface of the semiconductor chip 20 and thus functions as a drain terminal.

The lead frame post 11 is separate from the lead frame bed 10 and is electrically insulated from the lead frame bed 10 by the resin 50. The lead frame post 11 is electrically connected to a source electrode 21, provided on an upper surface of the semiconductor chip 20, through the source connector 30. A projecting portion 11P of the lead frame post 11 projects out of the resin 50 and functions as a source terminal. The lead frame bed 10 and the lead frame post 11 are made of, for example, copper, copper plated with nickel, copper plated with silver, copper plated with gold, copper alloy, or any metal or metal alloy which has low electrical resistance and high thermal conductivity, such as aluminum (Al).

The semiconductor chip 20 includes a semiconductor element on a semiconductor substrate. For example, a drain electrode of the semiconductor element is provided on a lower surface of the semiconductor chip 20 and a source electrode 21 of the semiconductor element is provided on an upper surface of the semiconductor chip 20. The semiconductor chip 20 is placed on the lead frame bed 10 and is bonded to the lead frame bed 10 via a conductive material 40 as shown in FIG. 2. The conductive material 40 is provided between the lead frame bed 10 and the semiconductor chip 20.

The source connector 30 is provided on the source electrode 21 of the semiconductor chip 20 and is bonded to the source electrode 21 via a conductive material 40, such as solder or a conductive paste, as shown in FIG. 2. The conductive material 40 is provided between the semiconductor chip 20 and the source connector 30. Therefore, the source connector 30 electrically connects the source electrode 21 of the semiconductor chip 20 to the lead frame post 11.

The resin 50 seals the semiconductor chip 20, the conductive material 40, and the source connector 30 and covers the lead frame bed 10 and the lead frame post 11 partially. Herewith, the resin 50 can protect the semiconductor chip 20 and the conductive material 40, and can insulate the drain electrode from the source electrode. The portion 10P of the lead frame bed 10 and the portion 11P of the lead frame post 11 project out of the resin 50.

The source connector 30 is provided so as to cover the entirety of the semiconductor chip 20 as shown in FIG. 1. That is, the semiconductor chip 20 cannot be seen when viewed from above because the source connector 30 completely blocks the view of the semiconductor chip 20. By this arrangement, electromagnetic noise from above the semiconductor chip 20 can be blocked. Shielding electric fields and magnetic fields is necessary in blocking an electromagnetic wave that might be noise to the semiconductor chip 20. A highly conductive material such as copper or aluminum has high shielding effect against electric fields. A highly magnetic permeable material such as nickel or iron has high shielding effect against magnetic fields. That is, using copper, aluminum, iron, nickel, or alloy including at least one of these materials as a source connector 30 could prevent degradation of the reliability of the semiconductor device 100 which can be caused by an electromagnetic noise.

(Second Embodiment)

Figure 3:
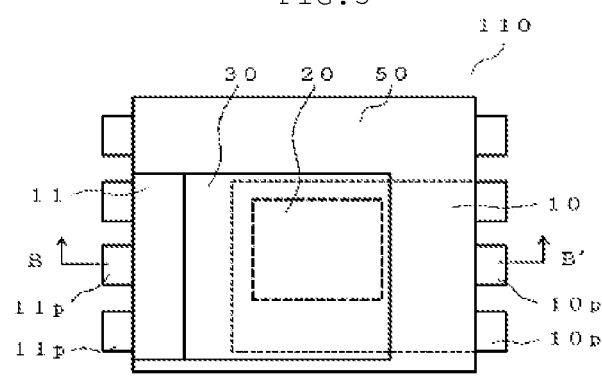
FIG. 3 shows a schematic plan view of a semiconductor device according to a second embodiment when viewed at B1-B1' line shown in FIG. 4.
Figure 4:
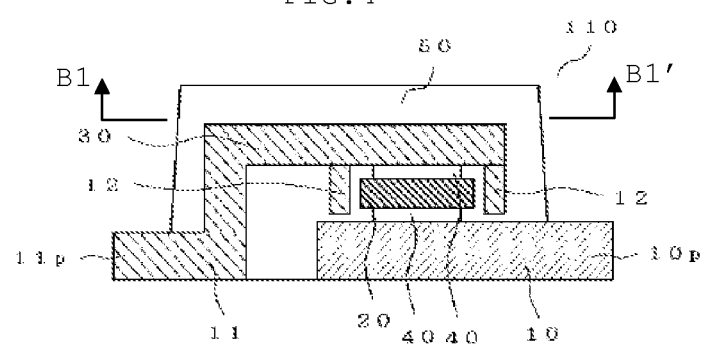
FIG. 4 shows a cross-sectional view of a semiconductor device according to the second embodiment taken along B-B' line shown in FIG. 3.

FIG. 3 shows a schematic plan view of a semiconductor device 110 according to a second embodiment. FIG. 4 shows a cross-sectional view taken along B-B' line shown in FIG. 3. The source connector 30 includes a metal part (third metal part) 12 which extends toward the lead frame bed 10. The metal part 12 is provided to surround the semiconductor chip 20 in a plane parallel to upper or lower surface of the semiconductor chip 20. Accordingly, an electromagnetic wave can prevented from reaching the semiconductor chip 20 via a sideways direction. As the gap between the metal part 12 and the lead frame bed 10 is narrower than the gap between source connector 30 and the lead frame bed 10 that would exist in the absence of the metal part 12 (compare FIG. 2), shielding of electromagnetic noise is improved.

For example, an electromagnetic wave having a frequency less than or equal to 100 GHz will have wavelength longer than or equal to 1 mm and this type of electromagnetic wave (noise) will generally have a negative effect on a semiconductor device. Generally, an electromagnetic wave propagates poorly through a gap if it has a wavelength that is greater than the width of the gap. Therefore, the gap between the metal part 12 and the lead frame bed 10 is preferably narrower than or equal to 1 mm. The source connector 30 including the metal part 12 is connected to the source electrode 21. The lead frame bed 10 is connected to the drain electrode. Accordingly, if the metal part 12 gets too close to the lead frame bed 10, a dielectric breakdown may occur in the resin 50 that insulates the metal part 12 from the lead frame bed 10 and then it is possible that a current flows between the metal part 12 and the lead frame bed 10. For example, a dielectric breakdown voltage of epoxy resin, which is conventionally used as a packaging resin, is 10 kV/mm. If the potential between the metal part 12 and the lead frame bed 10 is about 1 kV, the gap between the metal part 12 and the lead frame bed 10 is preferably greater than or equal to 100 μm.

(Third Embodiment)

Figure 5:
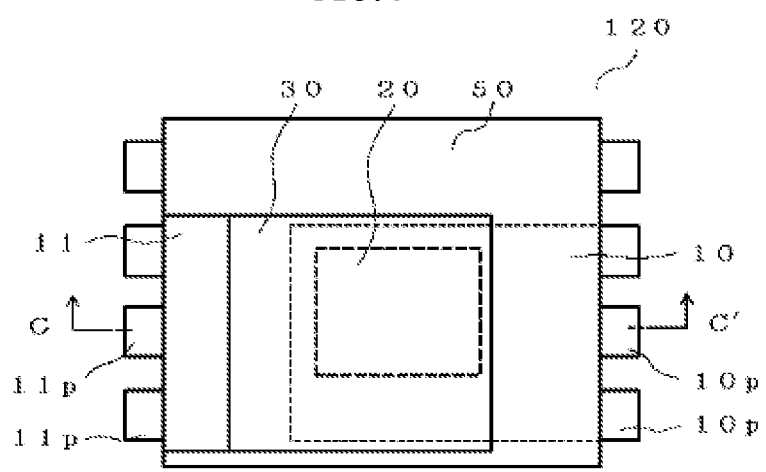
FIG. 5 shows a schematic plan view of a semiconductor device according to a third embodiment when viewed at C1-C1' line shown in FIG. 6.
Figure 6:
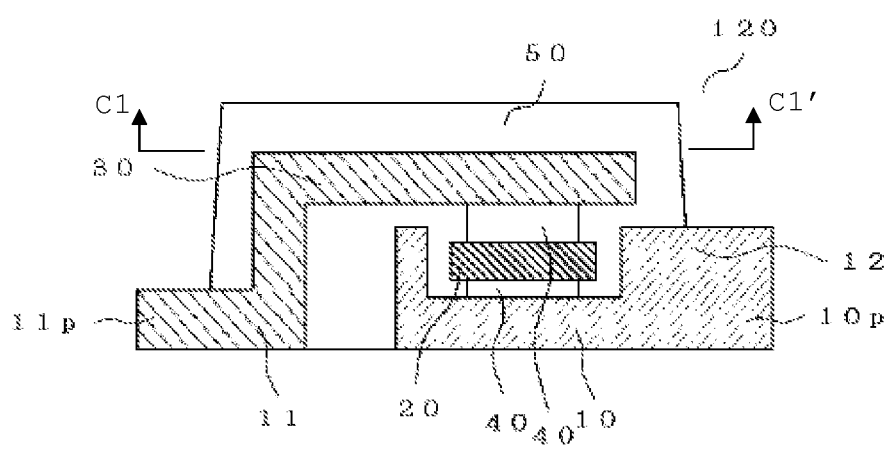
FIG. 6 shows a cross-sectional view of a semiconductor device according to a third embodiment taken along C-C' line shown in FIG. 5.

FIG. 5 shows a schematic plan view of a semiconductor device 120 according to a third embodiment. FIG. 6 shows a cross-sectional view taken along C-C' line shown in FIG. 5. The lead frame bed 10 includes a metal part (third metal part) 12 extending toward the source connector 30. The metal part 12 is provided to surround the semiconductor chip 20. Accordingly, shielding from electromagnetic waves for the semiconductor chip 20 can be improved. As a gap between the metal part 12 and the source connector 30 becomes narrower, shielding is improved as was the case in the second embodiment.

For similar reasons affecting the gap sizing in the second embodiment, it is preferable for the gap between the metal part 12 and the lead frame bed 10 to be narrower than or equal to 1 mm. The source connector 30 is connected to the source electrode 21. The lead frame bed 10 including the metal part 12 is connected to the drain electrode. Accordingly, if the metal part 12 gets too close to the source connector 30, a dielectric breakdown can occur in the resin 50 insulating the metal part 12 from the source connector 30 and then it is possible that a current flows between the metal part 12 and the source connector 30. For example, a dielectric breakdown voltage of epoxy resin is 10 kV/mm. If the potential between the metal part 12 and the source connector 30 is about 1 kV, then the gap between the metal part 12 and the source connector 30 is preferably greater than or equal to 100 μm.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A packaged semiconductor device, comprising:
   a first metal lead frame portion having a chip mounting surface;
   a second metal lead frame portion;
   a semiconductor chip having a first surface facing and attached to the chip mounting surface of the first metal lead frame portion and a second surface facing away from the chip mounting surface of the first metal lead frame portion;
   a connector portion electrically connected to the second metal lead frame portion, the connector portion being attached to the second surface of the semiconductor chip, the connector portion covering the entirety of a planar area of the semiconductor chip when viewed along a direction orthogonal to the second surface of the semiconductor chip; and
   a third metal lead frame portion surrounding an outer edge perimeter of the semiconductor chip for at least a portion of a thickness of the semiconductor chip between the first and second surfaces.

2. The packaged semiconductor device according to claim 1, wherein the third metal lead frame portion is connected to the connector portion.

3. The packaged semiconductor device according to claim 2, wherein a gap from the chip mounting surface of the first metal lead frame portion to the third metal lead frame portion is greater than or equal to 100 μm and less than or equal to 1 mm.

4. The packaged semiconductor device according to claim 1, wherein the third metal lead frame portion is connected to the first metal lead frame portion.

5. The packaged semiconductor device according to claim 4, wherein a gap from the connector portion to the third metal lead frame portion is greater than or equal to 100 μpm and less than or equal to 1 mm.

6. The packaged semiconductor device according to claim 1, wherein the third metal lead frame portion, the connector portion, and the second metal lead frame portion are integral parts of a same lead frame.

7. The packaged semiconductor device according to claim 1, wherein the third metal lead frame portion and the first metal lead frame portion are integral parts of a same lead frame.

8. The packaged semiconductor device according to claim 1, wherein the first metal lead frame portion, the semiconductor chip, the connector portion, and the second metal lead frame portion are encapsulated in an epoxy resin.

9. The packaged semiconductor device according to claim 1, wherein the semiconductor chip is soldered to the chip mounting surface.

10. The packaged semiconductor device according to claim 1, wherein the semiconductor chip is mounted to the chip mounting surface with conductive paste.

11. The packaged semiconductor portion according to claim 1, wherein the connector portion comprises a metal selected from a group consisting of copper, aluminum, iron, and nickel.

12. The packaged semiconductor portion according to claim 1, wherein the connector portion comprises an alloy of at least one metal selected from a group consisting of copper, aluminum, iron, and nickel.

13. A packaged semiconductor device, comprising:
a semiconductor chip having a first surface on a first side and a second surface on a second side opposite the first side;
a first metal lead frame portion having a chip mounting surface; and
a second metal lead frame portion including a connector portion, wherein
the first surface of the semiconductor chip is mounted on the chip mounting surface,
the second surface of the semiconductor chip is attached to the connector portion,
the connector portion covers the entirety of a planar area of the semiconductor chip when viewed along a direction orthogonal to the second surface of the semiconductor chip, and
the first metal lead frame portion has a third metal lead frame portion that extends from the chip mounting surface and surrounds an outer edge perimeter of the semiconductor chip for at least a portion of a thickness of the semiconductor chip between the first and second surfaces.

14. A packaged semiconductor device, comprising:
a semiconductor chip having a first surface on a first side and a second surface on a second side opposite the first side;
a first metal lead frame portion having a chip mounting surface; and
a second metal lead frame portion including a connector portion, wherein
the first surface of the semiconductor chip is mounted on the chip mounting surface,
the second surface of the semiconductor chip is attached to the connector portion,
the connector portion covers the entirety of a planar area of the semiconductor chip when viewed along a direction orthogonal to the second surface of the semiconductor chip, and
the second metal lead frame portion has a third metal lead frame portion that extends from a surface of the connector and surrounds an outer edge perimeter of the semiconductor chip for at least a portion of a thickness of the semiconductor chip between the first and second surfaces.

15. The packaged semiconductor device according to claim 13, wherein the first metal lead frame portion, the semiconductor chip, and the second metal lead frame portion are encapsulated in an epoxy resin.

16. A packaged semiconductor device, comprising:
a first metal lead frame portion having a chip mounting surface;
a second metal lead frame portion;
a semiconductor chip having a first surface facing and attached to the chip mounting surface of the first metal lead frame part and a second surface facing away from the chip mounting surface of the first metal lead frame part;
a connector portion electrically connected to the second metal lead frame portion, the connector portion being attached to the second surface of the semiconductor chip, the connector portion covering the entirety of a planar area of the semiconductor chip when viewed along a direction orthogonal to second surface of the semiconductor chip;
a third metal lead frame portion surrounding an outer edge perimeter of the semiconductor chip for at least a portion of a thickness of the semiconductor chip between the first and second surfaces; and
a resin covering the first metal lead frame portion, the second metal lead frame portion, the semiconductor chip, the connector portion, and the third metal lead frame portion.

17. The packaged semiconductor device according to claim 16, wherein the third metal lead frame portion and the first metal lead frame portion are integral parts of a same lead frame.

18. The packaged semiconductor device according to claim 16, wherein the third metal lead frame portion, the connector portion, and the second metal lead frame portion are integral parts of a same lead frame.

19. The packaged semiconductor device according to claim 14, wherein the first metal lead frame portion, the semiconductor chip, and the second metal lead frame portion are encapsulated in an epoxy resin.

* * * * *